(12) United States Patent
Lu

(10) Patent No.: US 9,224,892 B2
(45) Date of Patent: Dec. 29, 2015

(54) SILICON THIN FILM SOLAR CELL HAVING IMPROVED HAZE AND METHODS OF MAKING THE SAME

(75) Inventor: Songwei Lu, Wexford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 620 days.

(21) Appl. No.: 12/643,299

(22) Filed: Dec. 21, 2009

(65) Prior Publication Data

US 2011/0146767 A1 Jun. 23, 2011

(51) Int. Cl.
*C23C 16/00* (2006.01)
*H01L 31/0236* (2006.01)
*H01L 31/0392* (2006.01)
*H01L 31/18* (2006.01)

(52) U.S. Cl.
CPC ...... *H01L 31/0236* (2013.01); *H01L 31/03921* (2013.01); *H01L 31/1884* (2013.01); *Y02E 10/50* (2013.01)

(58) Field of Classification Search
CPC ............ H01L 31/0236; H01L 31/03921; H01L 31/1884; Y02E 10/50
USPC ..................................................... 427/248.1
See application file for complete search history.

(56) References Cited

U.S. PATENT DOCUMENTS

| | | |
|---|---|---|
| 4,746,347 A | 5/1988 | Sensi |
| 4,792,536 A | 12/1988 | Pecoraro et al. |
| 4,853,257 A | 8/1989 | Henery |
| 4,971,843 A | 11/1990 | Michelotti et al. |
| 5,030,593 A | 7/1991 | Heithoff |
| 5,030,594 A | 7/1991 | Heithoff |
| 5,240,886 A | 8/1993 | Gulotta et al. |
| 5,385,872 A | 1/1995 | Gulotta et al. |
| 5,393,593 A | 2/1995 | Gulotta et al. |
| 5,401,305 A | 3/1995 | Russo et al. |
| 5,464,657 A | 11/1995 | Athey et al. |
| 5,599,387 A | 2/1997 | Neuman et al. |
| 5,714,199 A | 2/1998 | Gerhardinger et al. |
| 2002/0036011 A1* | 3/2002 | Takato et al. ............. 136/261 |
| 2006/0029813 A1* | 2/2006 | Kutilek et al. ............ 428/426 |
| 2006/0046026 A1* | 3/2006 | Fujisawa et al. .......... 428/142 |
| 2006/0065299 A1* | 3/2006 | Fukawa et al. ............ 136/256 |
| 2007/0128838 A1* | 6/2007 | Aoki ......................... 438/480 |
| 2007/0184291 A1* | 8/2007 | Harris et al. ............... 428/469 |
| 2009/0183765 A1* | 7/2009 | Chiba et al. ............... 136/252 |

FOREIGN PATENT DOCUMENTS

DE 19713215 A1 10/1998
EP 1624494 A1 2/2006
(Continued)

OTHER PUBLICATIONS

International Search Report and Written Opinion for International Application No. PCT/US2010/059037, dated Jul. 7, 2011.

*Primary Examiner* — Kelly M Gambetta
(74) *Attorney, Agent, or Firm* — Andrew C. Siminerio

(57) ABSTRACT

A method of increasing the haze of a coating stack having a top layer and an undercoating layer using a chemical vapor deposition coating process includes at least one of: increasing a precursor flow rate; decreasing a carrier gas flow rate; increasing a substrate temperature; increasing a water flow rate; decreasing an exhaust flow rate; and increasing a thickness of at least one of the top layer or undercoating layer.

16 Claims, 1 Drawing Sheet

(56) References Cited

FOREIGN PATENT DOCUMENTS

| EP | 1677316 | A1 | | 7/2006 |
|---|---|---|---|---|
| EP | 1732139 | A1 | | 12/2006 |
| EP | 1950813 | A1 | * | 7/2008 |
| JP | 2002260448 | A | * | 9/2002 |
| WO | 2009/077605 | A2 | | 6/2009 |

* cited by examiner

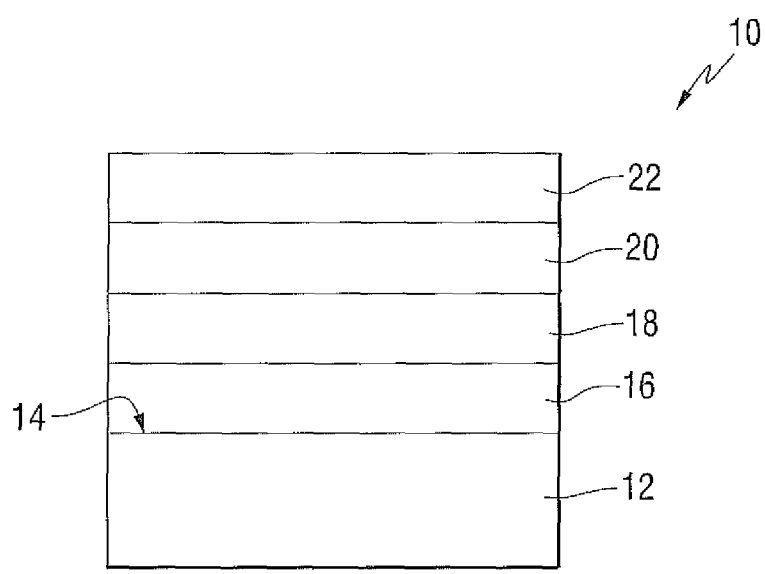

SILICON THIN FILM SOLAR CELL HAVING IMPROVED HAZE AND METHODS OF MAKING THE SAME

BACKGROUND OF THE INVENTION

1. Field of the Invention

This invention relates generally to solar cells and, in one particular embodiment, to an amorphous silicon thin film solar cell having improved haze characteristics.

2. Technical Considerations

A conventional amorphous silicon thin film solar cell typically includes a glass substrate over which is provided a transparent conductive oxide (TCO) contact layer and an amorphous silicon thin film active layer having a p-n junction. A rear metallic layer acts as a reflector and back contact. The TCO has an irregular surface to increase light scattering. In solar cells, light scattering or "haze" is used to trap light in the active region of the cell. The more light that is trapped in the cell, the higher the efficiency that can be obtained. However, the haze cannot be so great as to adversely impact upon the transparency of light through the TCO. Therefore, light trapping is an important issue when trying to improve the efficiency of solar cells and is particularly important in thin film cell design. However, with thin film devices, this light trapping is more difficult because the layer thicknesses are much thinner than those in previously know monocrystalline devices. As the film thicknesses are reduced, they tend toward coatings having predominantly parallel surfaces. Such parallel surfaces typically do not provide significant light scattering. This is particularly evident with coatings deposited by conventional chemical vapor deposition (CVD) coating methods. While conventional CVD coating methods provide advantages in throughput and cost, conventional CVD deposition tends to form smooth, uniform coating layers with a haze of less than 0.5% on a substrate. Such smooth coating layers do not typically provide layers having sufficient light scattering to significantly increase the efficiency of the solar cell.

Therefore, it would be desirable to provide a solar cell and a method of making the solar cell, particularly by a CVD method, having improved light scattering characteristics.

SUMMARY OF THE INVENTION

A method of controlling, e.g., increasing or decreasing, the haze of a coating stack is provided. A method of increasing the haze of a coating stack having a top layer and an undercoating layer comprises: depositing an undercoating layer having a surface roughness; and depositing a top layer over the undercoating layer by chemical vapor deposition such that the top layer has a surface roughness greater than that of the undercoating layer.

Another method of increasing the haze of a coating stack having a top layer and an undercoating layer using a chemical vapor deposition coating process comprises at least one of: increasing a precursor flow rate; decreasing a carrier gas flow rate; increasing a substrate temperature; increasing a water flow rate; decreasing an exhaust flow rate; and increasing a thickness of at least one of the top layer or undercoating layer.

A thin film solar cell comprises a transparent substrate having at least one major surface. A first coating is formed over at least a portion of the major surface, the first coating comprising one or more oxides selected from oxides of silicon, titanium, aluminum, tin, zirconium and/or phosphorus. A second coating is formed over at least a portion of the first coating, the second coating comprising one or more oxide materials selected from oxides of one or more of Zn, Fe, Mn, Al, Ce, Sn, Sb, Hf, Zr, Ni, Zn, Bi, Ti, Co, Cr, Si or In or an alloy of two or more of these materials.

BRIEF DESCRIPTION OF THE DRAWING

A complete understanding of the invention will be obtained from the following description when taken in connection with the accompanying drawing FIGURE.

FIG. 1 is a side, sectional view (not to scale) of a solar cell incorporating features of the invention.

DESCRIPTION OF THE PREFERRED EMBODIMENTS

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 200 nm to less than 380 nm. The terms "microwave region" or "microwave radiation" refer to electromagnetic radiation having a frequency in the range of 300 megahertz to 300 gigahertz. Additionally, all documents, such as, but not limited to, issued patents and patent applications, referred to herein are to be considered to be "incorporated by reference" in their entirety. In the following discussion, the refractive index values are those for a reference wavelength of 550 nanometers (nm).

The term "film" refers to a region of a coating having a desired or selected composition. A "layer" comprises one or more "films". A "coating" or "coating stack" is comprised of one or more "layers".

An exemplary solar cell 10 incorporating features of the invention is shown in FIG. 1. The solar cell 10 includes a substrate 12 having at least one major surface 14. A first coating 16 (undercoating layer) of the invention is formed over at least a portion of the major surface 14. A second coating 18 (transparent conductive oxide or "TCO") is formed over at least a portion of the first coating 16. A layer of amorphous silicon 20 is formed over at least a portion of the second coating 18. A metal or metal-containing layer 22 is formed over at least a portion of the amorphous silicon layer 20.

In the broad practice of the invention, the substrate 12 can include any desired material having any desired characteristics. For example, the substrate can be transparent or translucent to visible light. By "transparent" is meant having a visible light transmittance of greater than 0% up to 100%. Alternatively, the substrate 12 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); glass substrates; or mixtures or combinations of any of the above. For example, the substrate 12 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. Although not limiting to the invention, examples of glass suitable for the substrate are described in U.S. Pat. Nos. 4,746,347; 4,792,536; 5,030,593; 5,030,594; 5,240,886; 5,385,872; and 5,393,593. Non-limiting examples of glass that can be used for the practice of the invention include Solargreen®, Solextra®, GL-20®, GL35™, Solarbronze®, Starphire®, Solarphire®, Solarphire PV® and Solargray® glass, all commercially available from PPG Industries Inc. of Pittsburgh, Pa.

The substrate 12 can be of any desired dimensions, e.g., length, width, shape, or thickness. For example, the substrate 12 can be planar, curved, or have both planar and curved portions. In one non-limiting embodiment, the substrate 12 can have a thickness in the range of 1 mm to 10 mm, such as 1 mm to 5 mm, such as 2 mm to 4 mm, such as 3 mm to 4 mm.

The substrate 12 can have a high visible light transmission at a reference wavelength of 550 nanometers (nm). By "high visible light transmission" is meant visible light transmission at 550 nm of greater than or equal to 85%, such as greater than or equal to 87%, such as greater than or equal to 90%, such as greater than or equal to 91%, such as greater than or equal to 92%.

In the practice of the invention, the first coating 16 (undercoating layer) can be used to affect, e.g., increase, the roughness ("haze") of the subsequently applied second coating 18, as described below. It has been found that by intentionally introducing a slight haze or roughness (e.g., surface roughness) to the undercoating layer 16, this haze is amplified at the surface of the second coating layer 18. This is believed due to the crystal structure mismatching of the second layer 18 on the undercoating layer 16.

Methods for increasing the roughness of the first coating 16 and/or second coating 18 will be described below. In one non-limiting embodiment, the first coating 16 comprises one or more oxides selected from oxides of silicon, titanium, aluminum, tin, zirconium and/or phosphorus. The oxides can be present in any desired proportions. For example, the first coating 16 can comprise silica. Alternatively, the first coating 16 can comprise a mixture of silica and titania, with the silica present in the range of 0.1 weight percent (wt. %) to 99.9 wt. % and the titania present in the range of 99.9 wt. % to 0.1 wt. %. The first coating 16 can be a homogeneous coating. Alternatively, the first coating 16 can be a gradient coating with the relative proportions of the constituents, for example, silica and titania, varying through the coating. For example, the first coating 16 can be primarily silica in the region adjacent the substrate 12 surface and primarily titania at the outer region of the first coating 16 (i.e., the surface away from the substrate 12). For example, the first coating 16 can be silica having a thickness in the range of 80 nm to 90 nm.

As discussed above, the first coating 16 can include mixtures of at least two oxides having elements selected from silicon, titanium, aluminum, tin, zirconium and/or phosphorus. Such mixtures include, but are not limited to, titania and phosphorous oxide; silica and alumina; titania and alumina; silica and phosphorous oxide; titania and phosphorous oxide; silica and tin oxide, tin oxide and phosphorous oxide, titania and tin oxide, alumina and tin oxide, silica and zirconia; titania and zirconia; alumina and zirconia; alumina and phosphorous oxide; zirconia and phosphorous oxide; or any combination of the above materials. The relative proportions of the oxides can be present in any desired amount, such as 0.1 wt. % to 99.9 wt. % of one material and 99.9 wt. % to 0.1 wt. % of the other material.

Additionally, the first coating 16 can include mixtures of at least three oxides, such as but not limited to, three or more oxides having elements selected from silicon, titanium, aluminum, tin, zirconium and/or phosphorus. Examples include, but are not limited to, mixtures comprising silica, titania and phosphorous oxide; silica, tin oxide and phosphorus oxide; silica, titania and alumina; and silica, titania and zirconia. For example, the first coating 16 can comprise a mixture of silica and titania with at least one other oxide selected from alumina, zirconia, and phosphorous oxide. For another example, the first coating 16 can comprise a mixture of silica and tin oxide with at least one other oxide selected from alumina, zirconia, and phosphorous oxide. The relative proportions of the oxides can be present in any desired amount, such as 0.1 wt. % to 99.9 wt. % of one material, 99.9 wt. % to 0.1 wt. % of a second material, and 0.1 wt. % to 99.9 wt. % of a third material.

One particular first coating 16 of the invention comprises a mixture of silica, titania and phosphorous oxide. The silica can be present in the range of 30 volume percent (vol. %) to 80 vol. %. The titania can be present in the range of 5 vol. % to 69 vol. %. The phosphorous oxide can be present in the range of 1 vol. % to 15 vol. %.

In another non-limiting embodiment, the first layer 16 can comprise anatase titania. It has been discovered that the use of an anatase titania first layer 16 can increase the haze of the second layer 18. This is believed to be due to the crystalline mismatch between the titania undercoating layer 16 and the second layer 18 formed over the undercoating layer 16.

The first coating 16 can have any desired thickness, such as but not limited to, 10 nm to 120 nm, such as 30 nm to 100 nm, such as 30 nm to 90 nm, such as 40 nm to 90 nm, such as 50 nm to 90 nm, such as 70 nm to 90 nm, such as 80 nm to 90 nm.

In one non-limiting embodiment, the second coating 18 comprises at least one conductive oxide layer, such as a doped oxide layer. For example, the second coating 18 can include one or more oxide materials, such as but not limited to, one or more oxides of one or more of Zn, Fe, Mn, Al, Ce, Sn, Sb, Hf, Zr, Ni, Zn, Bi, Ti, Co, Cr, Si or In or an alloy of two or more of these materials, such as zinc stannate. The second coating 18 can also include one or more dopant materials, such as but not limited to, F, In, Al, P, and/or Sb. In one non-limiting embodiment, the second coating 18 is a fluorine doped tin oxide coating, with the fluorine present in the coating precursor materials in an amount less than 20 wt. % based on the total weight of the precursor materials, such as less than 15 wt. %, such as less than 13 wt. %, such as less than 10 wt. %, such as less than 5 wt. %. The second coating 18 can be amorphous, crystalline or at least partly crystalline.

The second coating 18 can have a thickness greater than 200 nm, such as greater than 250 nm, such as greater than 350 nm, such as greater than 380 nm, such as greater than 400 nm, such as greater than 420 nm, such as greater than 500 nm, such as greater than 600 nm. In one non-limiting embodiment, the second coating 18 comprises fluorine doped tin oxide and has a thickness as described above, such as in the range of 350 nm to 1,000 nm, such as 400 nm to 800 nm, such as 500 nm to 700 nm, such as 600 nm to 700 nm, such as 650 nm.

The second coating 18 (e.g., fluorine doped tin oxide) can have a sheet resistance of less than 15 ohms per square ($\Omega/\square$), such as less than 14$\Omega/\square$, such as less than 13.5$\Omega/\square$, such as less than 13$\Omega/\square$, such as less than 12$\Omega/\square$, such as less than 11$\Omega/\square$, such as less than 10$\Omega/\square$.

The second coating 18 can have a surface roughness (RMS) in the range of 5 nm to 60 nm, such as 5 nm to 40 nm, such as 5 nm to 30 nm, such as 10 nm to 30 nm, such as 10 nm to 20 nm, such as 10 nm to 15 nm, such as 11 nm to 15 nm. The surface roughness of the first coating 16 will be less than the surface roughness of the second coating 18.

The amorphous silicon layer 20 can have a thickness in the range of 200 nm to 1,000 nm, such as 200 nm to 800 nm, such as 300 nm to 500 nm, such as 300 nm to 400 nm, such as 350 nm.

The metal containing layer 22 can be metallic or can include one or more metal oxide materials. Examples of suitable metal oxide materials include, but are not limited to, oxides of one or more of Zn, Fe, Mn, Al, Ce, Sn, Sb, Hf, Zr, Ni, Zn, Bi, Ti, Co, Cr, Si or In or an alloy of two or more of these materials, such as zinc stannate. The metal containing layer 22 can have a thickness in the range of 50 nm to 500 nm, such as 50 nm to 300 nm, such as 50 nm to 200 nm, such as 100 nm to 200 nm, such as 150 nm.

The first coating 16 and/or second coating 18 can be formed over at least a portion of the substrate 12 by any conventional method, such as but not limited to, spray pyrolysis, chemical vapor deposition (CVD), or magnetron sputtered vacuum deposition (MSVD). In the spray pyrolysis method, an organic or metal-containing precursor composition having one or more oxide precursor materials, e.g., precursor materials for titania and/or silica and/or alumina and/or phosphorous oxide and/or zirconia, is carried in a suspension, e.g., an aqueous or non-aqueous solution, and is directed toward the surface of the substrate while the substrate is at a temperature high enough to cause the precursor composition to decompose and form a coating on the substrate. The composition can include one or more dopant materials. In a CVD method, a precursor composition is carried in a carrier gas, e.g., nitrogen gas, and is directed toward the heated substrate. In the MSVD method, one or more metal-containing cathode targets are sputtered under reduced pressure in an inert or oxygen-containing atmosphere to deposit a sputter coating over substrate. The substrate can be heated during or after coating to cause crystallization of the sputtered coating to form the coating.

In one non-limiting practice of the invention, one or more CVD coating apparatus can be employed at one or more positions in a conventional float glass ribbon manufacturing process. For example, CVD coating apparatus may be employed as the float glass ribbon travels through the tin bath, after it exits the tin bath, before it enters the annealing lehr, as it travels through the annealing lehr, or after it exits the annealing lehr. Because the CVD method can coat a moving float glass ribbon, yet withstand the harsh environments associated with manufacturing the float glass ribbon, the CVD method is particularly well suited to deposit coatings on the float glass ribbon in the molten tin bath. U.S. Pat. Nos. 4,853,257; 4,971,843; 5,536,718; 5,464,657; 5,714,199; and 5,599,387 describe CVD coating apparatus and methods that can be used in the practice of the invention to coat a float glass ribbon in a molten tin bath.

In one non-limiting embodiment, one or more CVD coaters can be located in the tin bath above the molten tin pool. As the float glass ribbon moves through the tin bath, the vaporized precursor composition can be added to a carrier gas and directed onto the top surface of the ribbon. The precursor composition decomposes to form a coating (e.g., first coating 16 and/or second coating 18) on the ribbon. The coating composition can be deposited on the ribbon at a location in which the temperature of the ribbon is less than 1300° F. (704° C.), such as less than 1250° F. (677° C.), such as less than 1200° F. (649° C.), such as less than 1190° F. (643° C.), such as less than 1150° F. (621° C.), such as less than 1130° F. (610° C.), such as in the range of 1190° F. to 1200° F. (643° C. to 649° C.). This is particularly useful in depositing a second coating 18 (e.g., fluorine doped tin oxide) having reduced surface resistivity since the lower the deposition temperature, the lower will be the resultant surface resistivity.

For example, to form a first coating 16 comprising silica and titania, the composition comprises both a silica precursor and a titania precursor. One non-limiting example of a silica precursor is tetraethylorthosilicate (TEOS).

Examples of titania precursors include, but are not limited to, oxides, sub-oxides, or super-oxides of titanium. In one embodiment, the titania precursor material can include one or more titanium alkoxides, such as but not limited to, titanium methoxide, ethoxide, propoxide, butoxide, and the like; or isomers thereof, e.g., titanium isopropoxide, tetraethoxide, and the like. Exemplary precursor materials suitable for the practice of the invention include, but are not limited to, tetraisopropyltitanate (TPT). Alternatively, the titania precursor material can be titanium tetrachloride. Examples of alumina precursors include, but are not limited to, dimethylaluminumisopropoxide (DMAP) and aluminum tri-sec-butoxide (ATSB). The dimethylaluminumisopropoxide can be made by mixing trimethylaluminum and aluminumisopropoxide at a molar ratio of 2:1 in an inert atmosphere at room temperature. Examples of phosphorous oxide precursors include, but are not limited to, triethyl phosphite. Examples of zirconia precursors include, but are not limited to, zirconium alkoxides.

A first coating 16 having a combination of silica and titania provides advantages over previous oxide combinations. For example, the combination of a low refractive index material such as silica (refractive index of 1.5 at 550 nm) with a high refractive index material such as titania (refractive index of 2.48 for anatase titania at 550 nm) allows the refractive index of the first coating 16 to be varied between these two extremes by varying the amount of silica and titania. This is particularly useful in providing the first coating 16 with color or iridescence suppression properties.

However, the deposition rate of titania is typically much faster than that of silica. Under typical deposition conditions, this limits the amount of silica to no more than about 50 wt. %, which, in turn, limits the lower range of the refractive index of the resultant silica/titania coating. Therefore, a dopant material can be added to the silica and titania precursor composition to accelerate the deposition rate of silica. The dopant forms part of the resultant oxide mixture and, therefore, can be selected to provide enhanced performance properties to the resultant coating. Examples of dopants useful for the practice of the invention include, but are not limited to, materials containing one or more of phosphorous, aluminum and zirconium to form oxides of these materials in the resultant coating. Examples of phosphorous oxide precursor materials include triethylphosphite. Examples of alumina precursor materials include aluminumtrisecbutoxide (ATSB) and dimethylaluminumisopropoxide (DMAP). Examples of zirconia precursors include zirconium alkoxide.

In one particular non-limiting embodiment, the first and/or second coatings are applied using a chemical vapor deposition coating process. It has been determined that the parameters of the CVD coating process can be used to adjust the haze of the deposited coating layer. For example, in order to increase the haze of a particular coating, one or more of the following parameters can be varied as follows: (1) increasing the flow rate of the precursor composition; (2) decreasing the flow rate of the carrier gas; (3) increasing the substrate temperature; (4) increasing the water flow rate; (5) decreasing the exhaust flow rate; and (6) increasing a thickness of the coating layer, particularly the top layer.

The following examples are provided to illustrate various non-limiting aspects of the invention. However, it is to be understood that the invention is not limited to these specific examples.

Example 1

This Example illustrates the affect of reducing the exhaust flow on the haze of the resultant coating.

In this Example, a fluorine doped tin oxide coating (Standard) was deposited using a conventional chemical vapor deposition coater during glass production. The standard sample has a haze of less than 0.5%. Next, a fluorine doped tin oxide coating was deposited using a chemical vapor deposition coater except the exhaust blower was completely stopped, leaving only exhaust flow from the ventilation system. The measured haze of 16.6% from this sample is shown in Table 1. As can be seen, decreasing the exhaust flow of the chemical vapor deposition coater significantly increases the haze of Sample 1.

TABLE 1

| Sample No. | Haze | Sheet Resistance | [Sn] ug/cm$^2$ | T % By Gardner Haze Guard Plus meter | Thickness (nm) |
|---|---|---|---|---|---|
| 1 | 16.6 | 10 Ω/□ | 207.6 | 78.6 | 587 |

Example 2

In this Example, various deposition parameters of a chemical vapor deposition system were adjusted to determine the affect on the haze of the resultant coating. Table 2 shows the various deposition parameters and measured properties.

TABLE 2

| Sample No. | MBTC flow rate (ml/hr) | TFA flow rate (ml/hr) | Water flow rate (ml/hr) | Exhaust Blower Speed (Hz) | Surface Resistance (Ω/□) | Transmittance By Gardner Haze Guard Plus (%) | Haze (%) |
|---|---|---|---|---|---|---|---|
| 2 | 40 | 2.3 | 8.7 | 18 | 10.9 | 83.0 | 1.7 |
| 3 | 40 | 2.3 | 8.7 | 9 | 6.7 | 77.1 | 23.3 |
| 4 | 40 | 2.3 | 17.4 | 18 | 11.1 | 84.0 | 3.1 |

As shown in Table 2, reducing the blower speed appeared to have more affect on haze than increasing the water flow rate.

Example 3

This Example illustrates the affect of inlet carrier gas flow rate on the haze of the resulting coating. As shown in Table 3, Sample numbers 5 and 6 were prepared using different inlet carrier gas flow rates. Samples 5 and 6 were deposited with the same chemical flow rate, same belt speed of 5 inches per minute, the same exhaust blower speed, and the same water/MBTC ratio. The only parameter that was changed was the inlet carrier gas flow rate. As shown in Table 3, Sample 5, having a higher carrier gas flow rate, had a lower haze (3.21%) than the sample with the lower flow rate. By decreasing the inlet flow rate by about half, the coating thickness only increases by about 25%, the surface resistance decreases by about 6.6%, but the haze increases by threefold.

TABLE 3

| Sample No. | Inlet Flow Rate (slm) | Sheet Resistance (Ω/□) | Transmittance (%) | Haze (%) | XRF [Sn] (ug/cm$^2$) |
|---|---|---|---|---|---|
| 5 | 100 | 8.8 | 82.3 | 3.21 | 223.6 |
| 6 | 53 | 7.6 | 81.75 | 13 | 281.1 |

Atomic force microscopy images of Samples 5 and 6 were studied and Sample 6 had a much rougher surface than Sample 5. As set forth in Table 4, Sample 6 is about 29% to 40% rougher than Sample 5. Scanning electron microscope images of Samples 5 and 6 show that Sample 5 has a smaller crystal grain size than Sample 6. There is also a significant change of (101) peak from Sample 5 to Sample 6, suggesting a significant growth of the (101) space for the higher haze Sample 6, according to X-ray diffraction results.

TABLE 4

| Sample No. | Measured area by AFM | | | | | |
|---|---|---|---|---|---|---|
| | 10 × 10µ Rq(nm) | 10 × 10µ Ra(nm) | 5 × 5µ Rq(nm) | 5 × 5µ Ra(nm) | 1 × 1µ Rq(nm) | 1 × 1µ Ra(nm) |
| 5 | 39.8 | 31.9 | 29.4 | 23.8 | 18.0 | 14.7 |
| 6 | 55.8 | 44.6 | 37.8 | 30.6 | 24.4 | 19.4 |

It will be readily appreciated by those skilled in the art that modifications may be made to the invention without departing from the concepts disclosed in the foregoing description. For example, the above discussion focused primarily on increasing the haze of a coating layer. It will be appreciated that the haze can also be decreased by reversing the above procedures. Accordingly, the particular embodiments described in detail herein are illustrative only and are not limiting to the scope of the invention, which is to be given the full breadth of the appended claims and any and all equivalents thereof.

The invention claimed is:

1. A method of increasing the haze of a coating stack comprising
depositing an undercoating layer using a chemical vapor deposition coating process, wherein the undercoating layer is a single layer having a surface roughness and comprises a mixture of silica, titania and phosphorous oxide;
an oxide of at least one of silicon, titanium, zirconium, tin, and aluminum, depositing a conductive oxide layer over at least a portion of the undercoating layer using the chemical vapor deposition coating process wherein the transparent conductive oxide layer comprises a conductive oxide layer selected from the group consisting of Zn, Fe, Mn, Al, Ce, Sn, Sb, Hf, Zr, Ni, Zn, Bi, Ti, Co, Cr, Si and In and wherein the conductive oxide layer is doped with a dopant selected from the group consisting of F, In, Al, P and Sb and wherein the conductive oxide layer has a surface roughness greater than the surface roughness of the undercoating layer; depositing an amorphous silicon film over at least a portion of the conductive oxide layer and performing at least one coating step to increase the haze of the coating stack selected from the group consisting of increasing a precursor flow rate; decreasing a carrier gas flow rate; and decreasing an exhaust flow rate.

2. The method of claim 1, wherein the coated article has a visible light transmittance of greater than 80% and a sheet resistance of less than 15Ω/□.

3. The method of claim 2, wherein the sheet resistance is less than 10Ω/□.

4. The method of claim 2, wherein the sheet resistance is in the range of 5Ω/□ to 9Ω/□.

5. The method of claim 1, including decreasing the exhaust flow rate to result in granular film deposition.

6. The method of claim 1, wherein the undercoating layer includes anatase titania.

7. The method of claim 1, wherein the silica is in the range of 30 vol. % to 80 vol. %, the titania is in the range of 5 vol. % to 69 vol. %, and the phosphorous oxide is in the range of 1 vol. % to 15 vol. %.

8. The method of claim 1, wherein the at least one coating step is decreasing the exhaust flow rate.

9. The method of claim 1, wherein the at least one coating step is decreasing the carrier gas flow rate.

10. The method of claim 1, wherein the at least one coating step is increasing the precursor flow rate.

11. The method of claim 1 further comprising a second coating step selected from the group consisting of increasing a precursor flow rate; decreasing the carrier gas flow rate; increasing the water flow rate; and decreasing the exhaust flow rate.

12. The claim of claim 1, wherein the at least one coating step is decreasing the exhaust flow rate; the method further comprises a second coating step comprising increasing the precursor flow rate, and a third coating step comprising decreasing the carrier gas flow rate.

13. The method of claim 1, wherein the conductive oxide layer is tin oxide doped with fluorine.

14. The method of claim 1 further comprising depositing a metal containing layer over at least a portion of the amorphous silicon layer.

15. The method of claim 14 wherein the metal containing layer comprises a metal oxide.

16. The method of claim 1, wherein the conductive oxide layer comprises a surface roughness in the range of 5 nm to 60 nm.

\* \* \* \* \*